United States Patent
Higuchi

(10) Patent No.: US 11,343,457 B2
(45) Date of Patent: May 24, 2022

(54) SOLID-STATE IMAGING DEVICE AND CLASS AB SUPER SOURCE FOLLOWER

(71) Applicant: PANASONIC SEMICONDUCTOR SOLUTIONS CO., LTD., Kyoto (JP)

(72) Inventor: Masahiro Higuchi, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 245 days.

(21) Appl. No.: 15/930,164

(22) Filed: May 12, 2020

(65) Prior Publication Data

US 2020/0275041 A1 Aug. 27, 2020

Related U.S. Application Data

(63) Continuation of application No. PCT/JP2018/041107, filed on Nov. 6, 2018.

(30) Foreign Application Priority Data

Nov. 29, 2017 (JP) .............................. JP2017-228496

(51) Int. Cl.
| | |
|---|---|
| H03F 3/08 | (2006.01) |
| H03F 3/30 | (2006.01) |
| H03F 3/50 | (2006.01) |
| H03M 1/12 | (2006.01) |
| H04N 5/378 | (2011.01) |
| H03F 3/04 | (2006.01) |
| H03M 1/66 | (2006.01) |

(52) U.S. Cl.
CPC .............. H04N 5/378 (2013.01); H03F 3/04 (2013.01); H03M 1/66 (2013.01); *H03F 2200/219* (2013.01)

(58) Field of Classification Search
None
See application file for complete search history.

(56) References Cited

U.S. PATENT DOCUMENTS

| | | |
|---|---|---|
| 5,239,210 A | 8/1993 | Scott |
| 7,733,182 B2 | 6/2010 | Pham et al. |
| 2011/0169990 A1* | 7/2011 | Higuchi ................... H03K 4/48 341/110 |
| 2016/0205333 A1 | 7/2016 | Shishido et al. |

FOREIGN PATENT DOCUMENTS

| | | |
|---|---|---|
| JP | H05-102740 A | 4/1993 |
| WO | 2015/079597 A1 | 6/2015 |

OTHER PUBLICATIONS

International Search Report and Written Opinion dated Jan. 29, 2019 in International Application No. PCT/JP2018/041107; with partial English translation.

* cited by examiner

*Primary Examiner* — Mark T Monk
(74) *Attorney, Agent, or Firm* — McDermott Will & Emery LLP

(57) ABSTRACT

An output buffer of a super source follower for driving a reference ramp signal of a column-parallel single slope type ADC of a solid-state imaging device is made as a class AB feedback configuration for controlling a feedback variable current source with a signal obtained by amplifying a current fluctuation flowing through an amplification transistor by an amplifier, and thereby, the upper limit of the drain voltage of the amplification transistor is not limited by the voltage between the gate and the source of the feedback variable current source.

10 Claims, 13 Drawing Sheets

SOLID-STATE IMAGING DEVICE AND CLASS AB SUPER SOURCE FOLLOWER

CROSS REFERENCE TO RELATED APPLICATIONS

This application is a U.S. continuation application of PCT International Patent Application Number PCT/JP2018/041107 filed on Nov. 6, 2018, claiming the benefit of priority of Japanese Patent Application Number 2017-228496 filed on Nov. 29, 2017, the entire contents of which are hereby incorporated by reference.

BACKGROUND

1. Technical Field

The present disclosure relates to an output buffer of a DAC (Digital to Analog Converter) circuit for driving a reference ramp signal of an ADC (Analog to Digital Converter) used in a solid-state imaging device.

2. Description of the Related Art

In general, a solid-state imaging device incorporates ADCs corresponding to respective columns of a pixel array and uses a column-parallel AD conversion method in which AD conversion of pixel output signals for one row of the pixel array is processed at a time within a horizontal scanning period. As a circuit system of the ADC, a single-slope ADC (hereinafter referred to as SS-ADC) having a small circuit size that fits in a region of each column width determined by a pixel pitch is used.

In addition, a method in which the SS-ADC is provided with a DAC for supplying a reference ramp signal common to the ADCs in all the columns, and a super source follower which is a low output impedance buffer circuit is used at an output stage of the DAC is known.

In addition, U.S. Pat. No. 7,733,182 discloses a related art using a hybrid Class AB super source follower in the output stage of a DAC.

SUMMARY

By the way, in a high-pixel solid-state imaging device, it is required to lower the analog power supply voltage in order to reduce power consumption that increases due to high-speed driving, an increase in circuit scale, and an increase in load due to a large area (first requirement).

On the other hand, since the reference ramp signal needs to have a voltage amplitude that can be compared with the saturation amplitude voltage of the pixel, even when the analog power supply voltage is reduced, the DAC output voltage amplitude is required to ensure an equivalent amplitude (second requirement).

However, if the related art disclosed in U.S. Pat. No. 7,733,182 is used for the DAC output buffer, there is a problem that the first and second requirements described above cannot be satisfied.

In view of the above problem, one aspect of the present disclosure proposes a new class AB super source follower having input and output ranges that are not limited by the analog power supply voltage and having an output impedance lower than an output impedance of the related art, and provides a solid-state imaging device that can sufficiently suppress streaking and random horizontal noise even when the number of pixels is large and can maximize the effective range of pixel output even at a low power supply voltage by using the new class AB super source follower for a DAC output buffer that drives a reference ramp signal of SS-ADC of a solid-state imaging device.

A solid-state imaging device according to one aspect of the present disclosure is a solid-state imaging device comprising: a pixel array including a plurality of light receivers; and a Digital to Analog Converter (DAC) circuit that generates and outputs a reference ramp signal, wherein the DAC circuit includes a reference signal generation circuit and an output buffer, and supplies, with a low output impedance, the reference ramp signal generated by the reference signal generation circuit to each of a plurality of comparators using the output buffer, and the output buffer includes: a first variable current source that supplies current to a load when current is supplied to the load; a second variable current source that draws current from the load; and a feedback circuit that performs current control of the first variable current source and the second variable current source.

A class AB super source follower according to one aspect of the present disclosure includes: a first transistor having a gate connected to an input terminal, a source connected to an output terminal and a first constant current source, and a drain connected to a second constant current source; a first variable current source that is connected to the output terminal, and supplies current to the load when current supply to a load connected to the output terminal is required; a second variable current source that is connected to the output terminal, and draws current from the load when current sinking from the load is required; and a feedback circuit that is connected to the drain of the first transistor and controls currents of the first variable current source and the second variable current source complementarily to each other based on a signal amplified by sensing a fluctuation in a current flowing through the first transistor.

If the class AB super source follower of one aspect of the present disclosure is used for an output buffer of a DAC for driving a reference ramp signal of a solid-state imaging device, a wide reference ramp signal amplitude can be ensured with respect to a power supply voltage range, so that even when the class AB super source follower of one aspect of the present disclosure is applied to lowering of the power supply voltage or a solid-state imaging device having a large pixel saturation output, a sufficiently wide ramp signal amplitude can be ensured. In addition, since the class AB super source follower of one aspect of the present disclosure has an output impedance smaller than the conventional output impedance, it has the effect of obtaining good image quality with reduced streaking and random horizontal noise.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Embodiment 1

Hereinafter, the solid-state imaging device according to Embodiment 1 of the present disclosure will be described with reference to the drawings.

Figure 1:
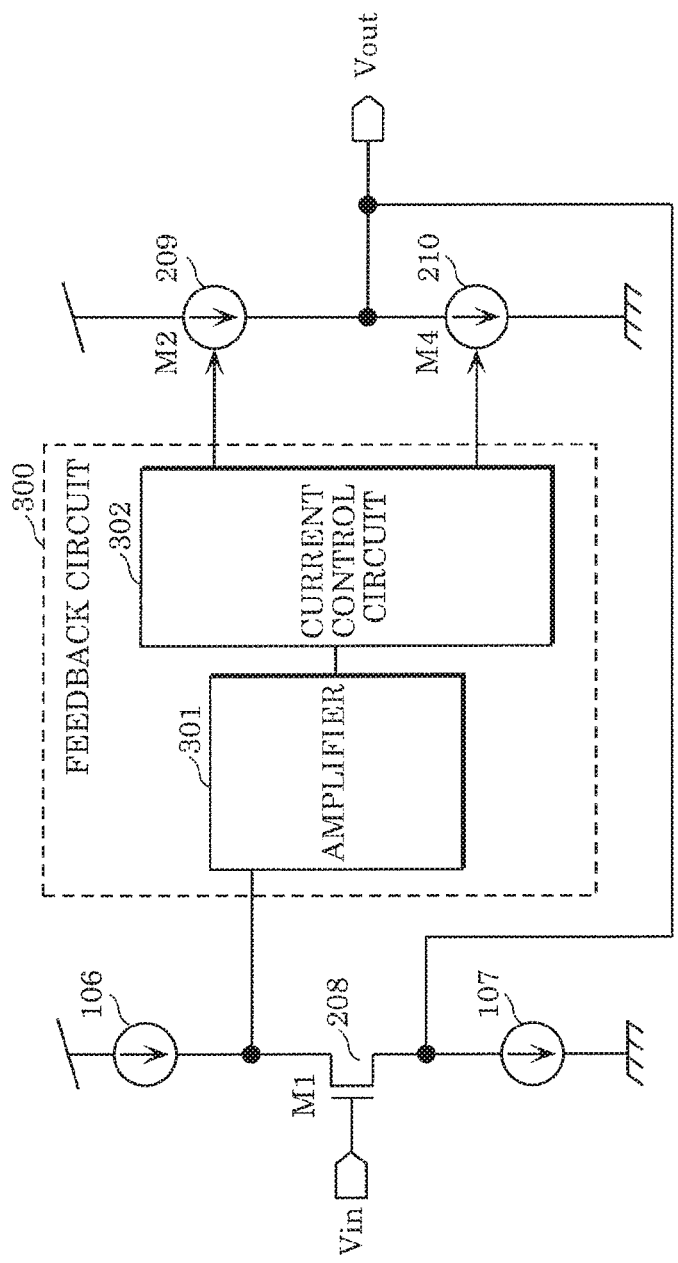
FIG. 1 is an overall configuration diagram of a class AB super source follower according to Embodiment 1 of the present disclosure.

FIG. 1 is an overall configuration diagram of a class AB super source follower used for the solid-state imaging device according to Embodiment 1 of the present disclosure.

As shown in FIG. 1, the class AB super source follower used in the solid-state imaging device according to Embodiment 1 of the present disclosure is configured to include input terminal Vin, output terminal Vout, transistor 208, and variable current sources (having a configuration of source-grounded transistor) 209 and, 210, constant current sources 106 and 107, feedback circuit 300, amplifier 301, and current control circuit 302.

As a basic operation, when a current flowing through the source-drain path of transistor 208 fluctuates due to a fluctuation in load current to output terminal Vout, feedback circuit 300 amplifies the fluctuation with internal amplifier 301, then outputs a control signal to variable current sources 209 and 210 based on the amplified signals in current control circuit 302 to control the currents of variable current sources 209 and 210 so as to cancel the fluctuation of the current flowing through the source-drain path of transistor 208.

Hereinafter, the details will be described, but for ease of description, the details will be described with reference to FIG. 2 in which the internal configuration of amplifier 301 and current control circuit 302 and the circuit configuration of each current source are specifically shown. In addition, a case where a monotonically decreasing reference ramp signal is input to the input signal Vin will be described as an example.

Figure 2:
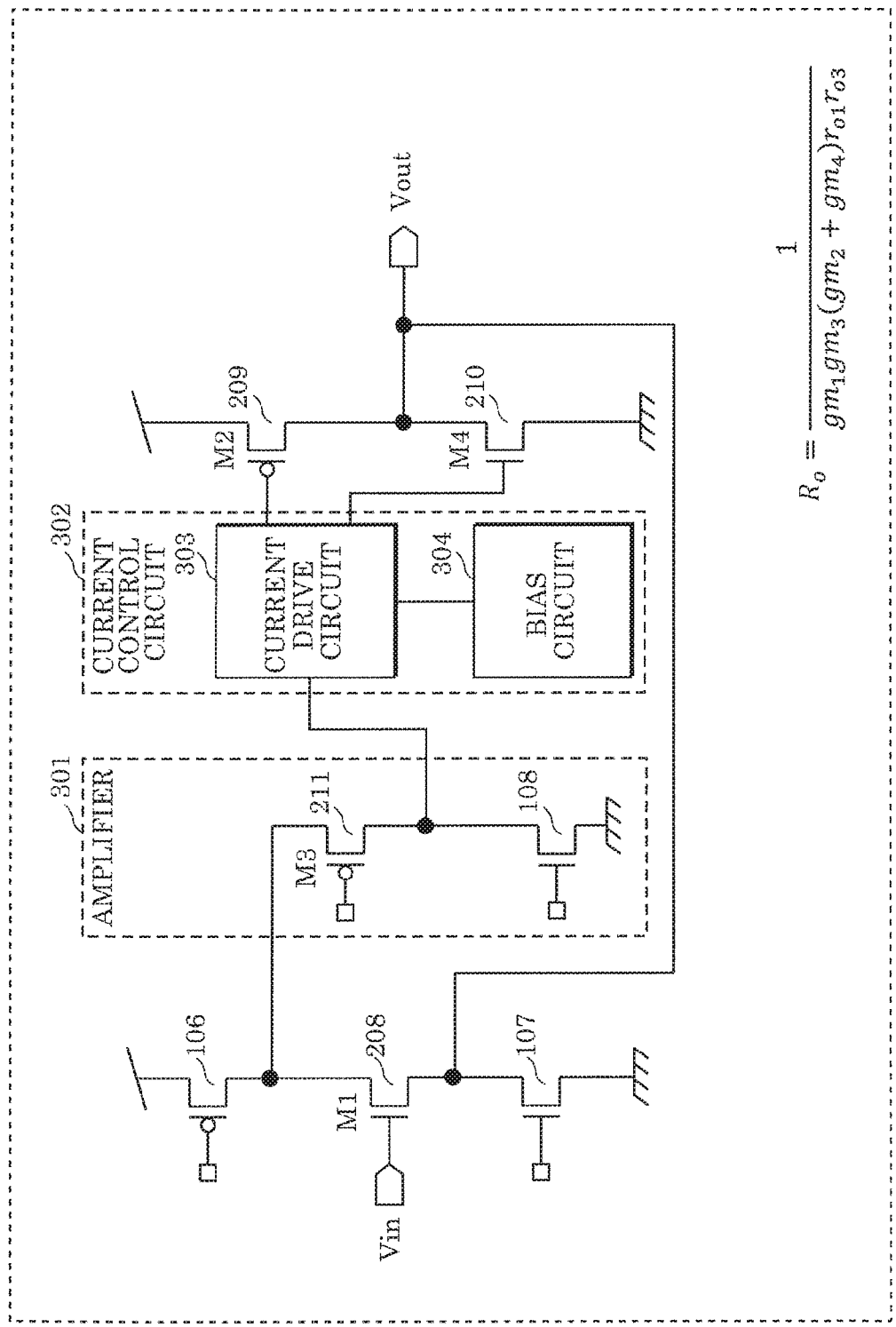
FIG. 2 is an internal configuration diagram of a class AB super source follower according to Embodiment 1 of the present disclosure.

In FIG. 2, constant current sources 106, 107 and 108 and variable current sources 209 and 210 are configured by source-grounded transistors. Amplifier 301 is a gate-grounded amplifier configured by transistor 211 having a gate voltage fixed to a predetermined potential and constant current source 108. The current of constant current source 106 is set equal to the sum of the currents of constant current sources 107 and 108.

In addition, current control circuit 302 is configured by current driving circuit 303 that drives the gate voltages of variable current sources 209 and 210 according to the output of amplifier 301, and bias circuit 304 that sets DC currents of variable current sources 209 and 210 to desired currents.

When the reference ramp signal is input from input terminal Vin, the voltage of Vout starts to decrease, and currents flows in from the load of the wiring capacitance of the reference ramp signal path and the load of the comparator capacitance of ADCs of all the columns. At this time, constant current source 107 starts drawing current, and the current in the source-drain path of transistor 208 decreases. However, since the current of constant current source 106 is constant, the drain voltage of transistor 208 increases.

Since the gate of transistor 211 is fixed in potential and the drain of transistor 208 is connected to the source of transistor 211, amplifier 301 amplifies a rise in the drain voltage of transistor 208 by the conductance of transistor 211, and outputs it as a voltage fluctuation in the rising direction.

Current driving circuit 303 generates in-phase signals having different voltage differences with respect to the output of amplifier 301 at an amplification factor of 1 to drive the gates of variable current sources 209 and 210.

That is, since the gate voltages of variable current sources 209 and 210 are controlled in the rising direction, the voltage between the gate and the source of variable current source 209 decreases, the current of variable current source 209 also decreases, and the voltage between the gate and the source of variable current source 210 increases, so that the current of variable current source 210 increases.

Therefore, since the current flowing in from the load is drawn by variable current source 210 and the current of constant current source 107 is maintained, the current of the source-drain path of transistor 208 is also maintained.

Here, in order to facilitate understanding of the present disclosure, a general circuit will be described with reference to the drawings.

Figure 3:
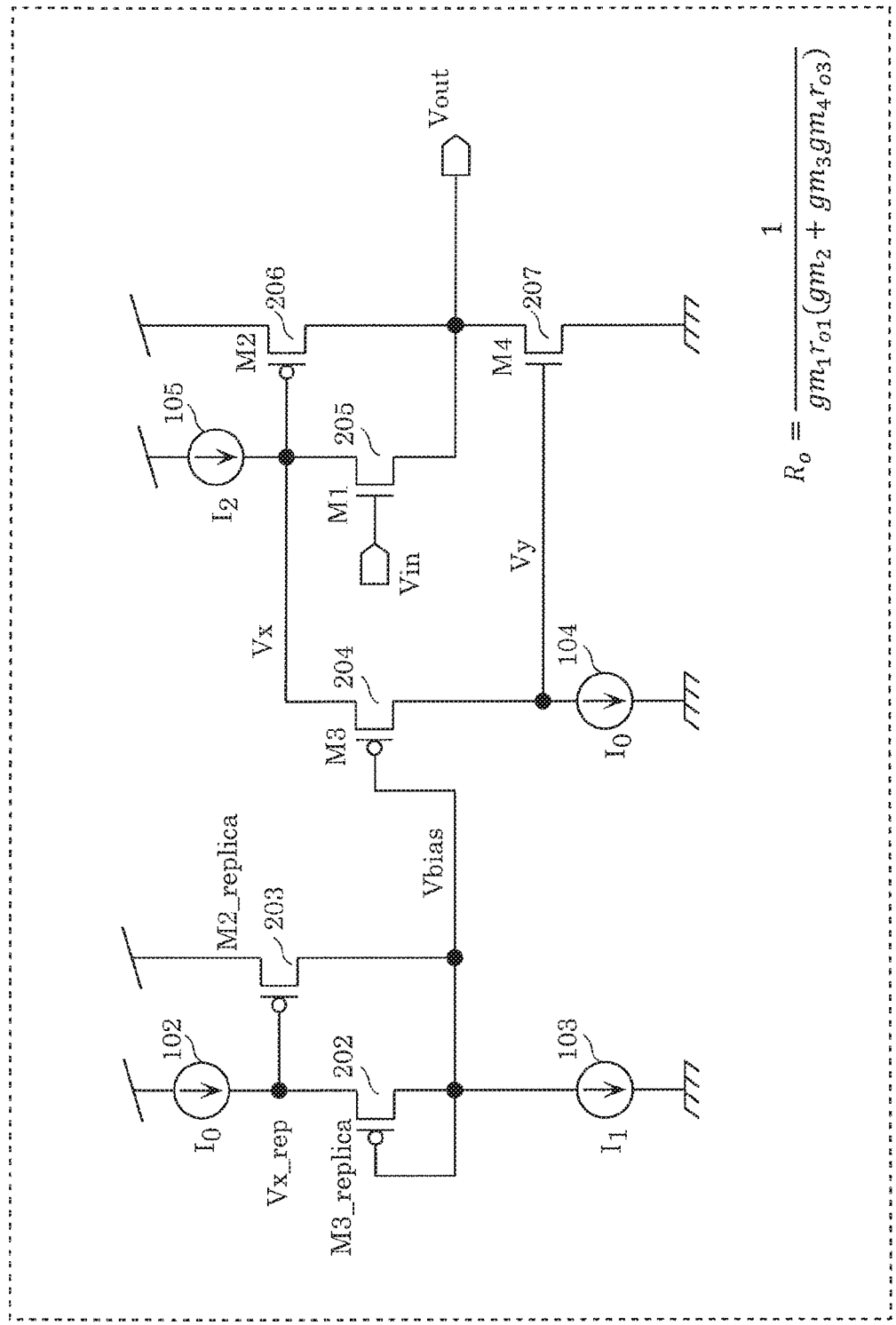
FIG. 3 is a diagram showing a general hybrid class AB super source follower.

FIG. 3 shows a circuit diagram of a general source follower.

This circuit obtains a class AB feedback configuration by controlling the gate of variable current source 206 via node Vx in accordance with the current fluctuation of transistor 205 and amplifying the current fluctuation of transistor 205 with a gate-grounded amplifier configured by transistor 204 and constant current source 104 to control the gate of variable current source 207 via node Vy in accordance with the amplified current fluctuation of transistor 205.

This output impedance is expressed by the following equation.

$$Ro \approx 1/[gm1 \times ro1(gm2+gm3 \times gm4 \times ro3)] \quad \text{(Equation 1)}$$

Here, gm1 is the conductance of transistor 205, gm2 is the conductance of variable current source 206, gm3 is the conductance of transistor 204, gm4 is the conductance of variable current source 207, ro1 is the resistance between the source and the drain of transistor 205, and ro3 is the resistance between the source and the drain of transistor 204.

As is clear from Equation 1, the impedance is reduced due to the effect of reduction by conductance gm3 of transistor 204 and conductance gm4 of variable current source 207.

According to this configuration, since the currents of variable current sources 206 and 207 can be automatically adjusted by feedback control to the currents corresponding to the reference ramp signal gradient in both directions of charging and discharging to and from the load, the state can be maintained with low impedance and the currents are increased only when needed, so that no extra power is also consumed.

This point will be described in details below with reference to FIG. 3.

In FIG. 3, the current flowing through variable current source 206 is controlled by the difference between the voltage of node Vx and the power supply voltage (the voltage between the gate and the source of variable current source 206), and the DC currents of variable current sources 206 and 207 are determined by the DC voltage of node Vx. The DC voltage of node Vx is determined by the voltage between the gate and the source at which the current flowing through transistor 204 becomes equal to the current of constant current source 104 with respect to gate potential Vbias of transistor 204 having the gate grounded.

The Vbias voltage is generated by a bias circuit configured by transistors 202 and 203 and constant current sources 102 and 103, which are replicas of gate-grounded transistor 204 and variable current source 206. By making the current of constant current source 102 equal to the current of constant current source 104, the voltage between the gate and the source of transistor 202 and the voltage between the gate and the source of transistor 204 become equal, and the DC voltage of node Vx_rep matches the DC voltage of node Vx, so that the DC currents flowing through transistors 203 and 206 can be equalized. Since the current flowing through transistor 203 can be determined by the difference current between constant current sources 103 and 102, the DC current of variable current source 206 can be set by the current of constant current source 103.

However, even when the reference ramp signal sweeps at the maximum gradient, the currents of variable current sources 206 and 207 must be set to currents that can follow the charging and discharging of the load of the comparator input capacitance of the reference ramp signal path and ADCs in all the columns according to the number of pixel array columns. Therefore, the voltage between the gate and the source of variable current source 206 increases as the gradient of the reference ramp signal increases, and the potential of node Vx decreases.

Here, when the power supply voltage is lowered, the potential of node Vx also further decreases in parallel. However, it is necessary to keep the DAC output voltage amplitude equivalent, and the upper limit voltage of Vout cannot be reduced, so that the potential difference between node Vx and Vout decreases as the voltage is lowered.

That is, since the voltage between the drain and the source of transistor 205 is reduced, transistor 205 may operate in a non-saturated region depending on the conditions of the upper limit voltages of the input Vin and the output Vout. In the non-saturated region, conductance gm1 of transistor 205 becomes small, and the output impedance shown in Equation 2 becomes large.

In order to avoid this state, the only way is to increase the potential of Vx, and the current capability of load drive of variable current sources 206 and 207 must be ensured, so that inevitably, the transistor size ratio (W/L) of variable current source 206 must be increased to reduce the voltage between the gate and the source as much as possible. However, this method involves an increase in the area of variable current source 206 and cannot reduce the voltage between the gate and the source below the sub-threshold voltage, so that the countermeasure effect is limited.

Therefore, in the general case, when the pixel saturation amplitude voltage is large and the analog power supply voltage is low, not only the output impedance increases, but also such a problem arises that the coexistence of the secure of an input range for AD conversion and the reduction of power consumption is difficult.

However, the solid-state imaging device and the class AB super source follower according to the embodiment of the present disclosure can solve the above-described problem. The details will be described later.

The output impedance of the class AB super source follower according to Embodiment 1 of the present disclosure is expressed by the following equation.

$$Ro \approx 1/[gm1 \times gm3 \times (gm2+gm4) \times ro1 \times ro3] \quad \text{(Equation 2)}$$

Where, gm1 is the conductance of transistor 208, gm2 is the conductance of variable current source 209, gm3 is the conductance of transistor 211, gm4 is the conductance of variable current source 210, ro1 is the resistance between the source and the drain of transistor 208, and ro3 is the resistance between the source and the drain of transistor 211.

As can be seen by comparing Equation 1 and Equation 2, since the amplification factor (gm3×ro3) of the amplifier is added to the conductance gm2 of variable current source 209 in the configuration of the present disclosure, the output impedance can be made lower than the output impedance of the related art.

Therefore, by using this circuit as a DAC output buffer that drives the reference ramp signal of the solid-state imaging device, current fluctuation due to kickback at the time of inversion of the comparator of the SS-ADC in each column and coupling noise got into the reference ramp signal wiring due to power fluctuation of the column circuit can be suppressed by the effect of low output impedance.

Note that the output impedance can be reduced as conductances gm2 and gm4 of variable current sources 209 and 210 are increased as shown in Equation 2.

Means for increasing the conductance include a method of increasing the transistor size ratio (W/L) of variable current sources 209 and 210 and a method of increasing the DC currents of variable current sources 209 and 210. When used as a DAC output buffer for driving a reference ramp signal of the solid-state imaging device, the DAC is often arranged in a peripheral area adjacent to a pixel area and a column circuit, and it is desirable that the DAC has a small area from the viewpoint of chip size. Therefore, the present disclosure employs a configuration for controlling the DC currents of variable current sources 209 and 210. In addition, by enabling the DC currents to be controlled by bias circuit 304, the output impedance of the DAC can be also adjusted to optimize the image quality.

Next, details of current control circuit 302 will be described.

Current driving circuit 303 receives a control signal from bias circuit 304 to control the DC currents flowing through variable current sources 209 and 210 in a state where the load is not charged or discharged, by the DC voltages of the respective gate voltages, and can control the output impedance by changing conductances gm2 and gm4 of variable current sources 209 and 210.

Since amplifier 301 and current control circuit 302 are located in the feedback loop, feedback works on the DC operating point of the internal circuit of current control circuit 302 so that the currents of variable current sources 209 and 210 match each other in a state where the load is not charged or discharged, and the DC operating point of the internal circuit of current control circuit 302 finally becomes the operating point when the voltage between the gate and the source is determined.

Therefore, when the DC current set by the control of bias circuit 304 is increased, both of the voltage between the gate and the sources of variable current sources 209 and 210 increases, and the voltage difference between the gate voltages decreases. Conversely, when the DC current is reduced, the voltage difference between the gate voltages increases.

In this way, since the voltage difference between the DC voltages of the gate voltages of variable current sources 209 and 210 fluctuates depending on the set DC currents, in order to stabilize the output impedance during operation, current driving circuit 303 includes the function of superimposing the AC voltage of the output signal of amplifier 301 on the DC voltages of both gate voltages while the voltage difference is maintained constant.

Note that the means for generating and maintaining the voltage difference between the gate voltages can be achieved by providing any of the following functions (A) and (B) in current control circuit 302. (A) Bias circuit 304 includes such a replica circuit inside bias circuit 304 that the connection configuration between current driving circuit 303 and variable current sources 209 and 210 is equivalent, and generates a control signal to be supplied to current driving circuit 303 necessary for setting the desired DC current to input the control signal to current driving circuit 303. (B) Current driving circuit 303 includes a sample and hold circuit to determine one of the voltage between the gate and the sources of variable current sources 209 and 210 based on the control signal from bias circuit 304 in a state where the load is not charged or discharged. After the other of the voltage between the gate and the sources is determined by the feedback operation, the voltage difference between the gate voltages is held by the sample and hold circuit. When the charge and discharge to the load occur, the sample and hold circuit is set to the hold state, and the operation of determining one of the voltage between the gate and the sources under the control of bias circuit 304 is released.

By utilizing the fact that the replicas of variable current sources 209 and 210 are not charged or discharged because the load is not connected, current control circuit 302 including the above (A) can generate a control signal regardless of the feedback control, so that the DC current can be set regardless of the operating state.

In addition, since current control circuit 302 including (B) holds the voltage difference between both gate voltages in the state where there is no charge or discharge to the load, that is, when input Vin and output Vout do not fluctuate by the sample and hold circuit, it is necessary to supply a timing signal for a sampling control from the outside, but no replica circuit as in (A) is required and can be realized by a small-scale circuit. In addition, since bias circuit 304 only needs to be operated only when the DC current is determined, the power can be also reduced during other periods. Furthermore, since there is no restriction on the lower limit of the voltage difference held by the sample and hold circuit, operation is possible even when the magnitude relationship between the both gate voltages is equal or reversed, for example, when the currents of variable current sources 209 and 210 are extremely large and the like. In this respect, there is an advantage that a wider load current can be handled than in (A).

Next, from the viewpoint of operation at a low power supply voltage, the superiority of the operation at a low power supply voltage will be described.

In the general configuration shown in FIG. 3, as described above, when the voltage between the gate and the source of variable current source 206 increases and the voltage between the drain and the source of transistor 205 goes lower than the saturation voltage, the operation is performed in the non-saturated region and the output impedance is increased. However, since the drain of transistor 208 is connected to amplifier 301 and is not directly connected to the gate of variable current source 209 in the configuration of the present disclosure shown in FIGS. 1 and 2, such a structure that the fluctuation of the voltage between the gate and the source of variable current source 209 does not affect the drain voltage of transistor 208 is achieved.

That is, when the DC current of variable current sources 209 and 210 increases under the control of bias circuit 304 in a state where the power supply voltage decreases, and the gate voltage decreases due to the increase in the voltage between the gate and the source of variable current source 209, the DC operating point of the output of amplifier 301 drops while maintaining the potential difference from the gate voltage to readjust the operating points of the entire feedback system and constant current source 108 of amplifier 301 has a constant current, so that the DC operating point of the source voltage of transistor 211, that is the DC operating point of the drain voltage of transistor 208 does not fluctuate. Note that this operation operates on the same principle not only for the control of the DC current by bias circuit 304 but also when a large supply current from variable current source 209 to the load is required.

Therefore, when input terminal Vin is at the maximum voltage and the power supply voltage is at the minimum voltage within the specification range, if the gate voltage of transistor 211 in amplifier 301 is set so that the voltage between the drain and the sources of transistor 208 and constant current source 106 do not fall below the saturation voltage, a low output impedance can be maintained without impairing the input signal range even at a low voltage.

Figure 4:
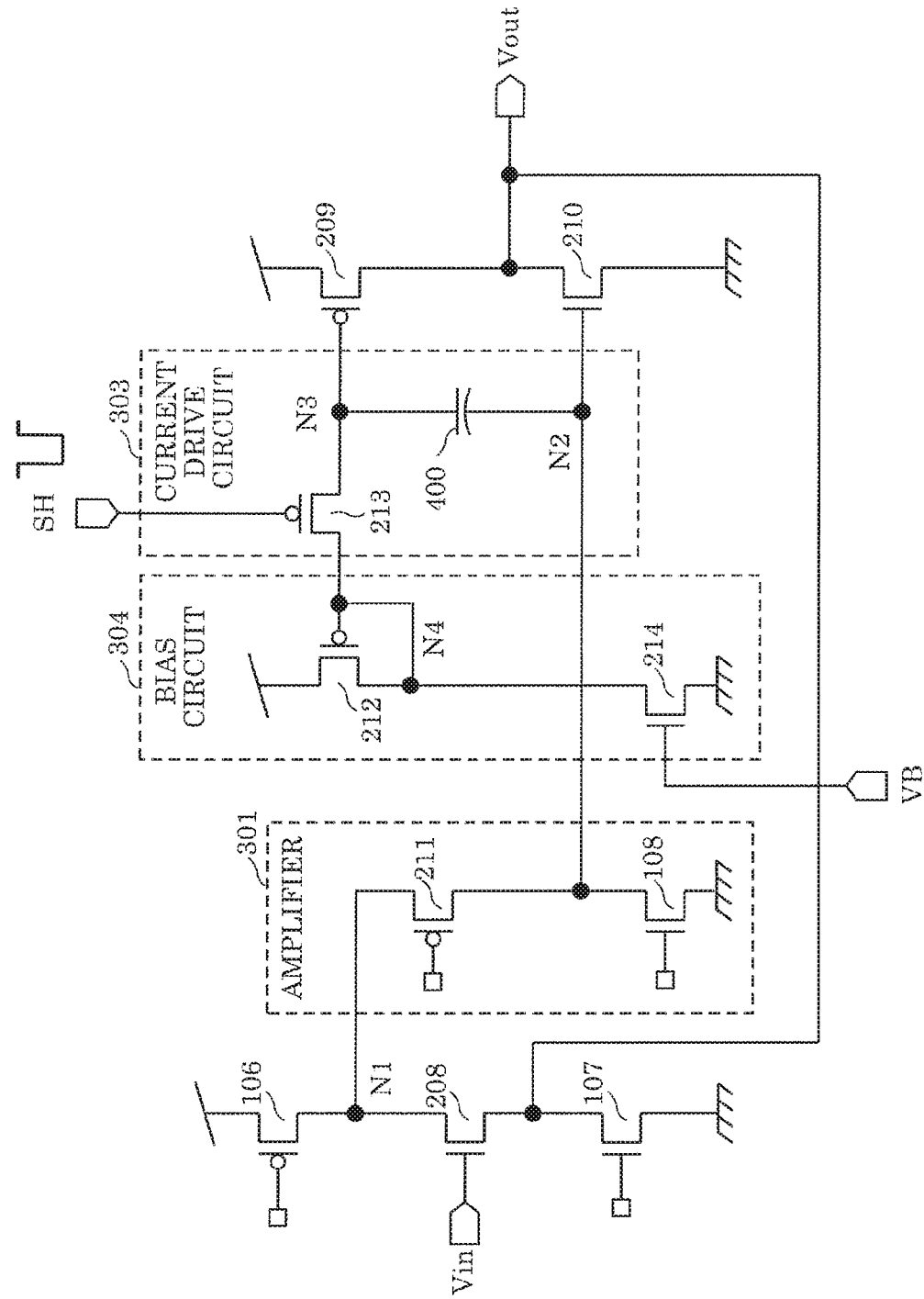
FIG. 4 is a diagram showing a class AB super source follower according to Embodiment 1 of the present disclosure.

FIG. 4 is a diagram showing a class AB super source follower according to Embodiment 1 of the present disclosure.

As shown in FIG. 4, the class AB super source follower according to Embodiment 1 of the present disclosure is configured to include input terminal Vin, output terminal Vout, output impedance control terminal VB, sample and hold control terminal SH, transistors 208, 211 and 212, variable current sources 214, 209 and 210, constant current sources 106, 107 and 108, MOS switch 213, capacitor 400, amplifier 301, current driving circuit 303, and bias circuit 304.

Constant current sources 106, 107 and 108 and variable current sources 214, 209 and 210 are configured by source-grounded transistors, and each of the gates of constant current sources 106, 107 and 108 is fixed at an arbitrary voltage so that the current of constant current source 106 is equal to the sum of the currents of constant current source 107 and constant current source 108.

Amplifier 301 is a gate-grounded amplifier consisting of transistor 211 having the gate voltage fixed to a predetermined voltage and constant current source 108. Since the DC voltage of the source of transistor 211, that is, the DC voltage of the drain (node N1) of transistor 208 is determined by the voltage between the gate and the source at which transistor 211 can flow the current of constant current source 108, the fixed voltage of the gate of transistor 211 is set as high as possible within a range where constant current source 106 does not fall within the non-saturated region. Normally, since the gate voltage of the constant current source is generated based on the ground potential in the case of an N-type transistor and based on the power supply in the case of a P-type transistor, the gate voltages of constant current source 106 and transistor 211 in FIG. 4 are always fixed relative to the power supply. Therefore, even if the power supply voltage of the DC voltage at node N1 drops, the state where constant current source 106 does not enter non-saturation can be maintained following the fluctuation. In addition, the voltage difference between the DC voltage of node N1 and the power supply voltage is about the saturation voltage of constant current source 106 and is generally smaller than the sub-threshold voltage, so that constant current source 106 can be used at a low power supply voltage.

Current driving circuit 303 includes a sample and hold circuit consisting of MOS switch 213 having gate connected to sample and hold control terminal SH and capacitor 400. An output of amplifier 301 is connected to one end of the gate of variable current source 210 and capacitor 400. The other end of capacitor 400 is connected to one end of the gate of variable current source 209 and MOS switch 213, and the other end of MOS switch 213 is connected to the output of bias circuit 304.

Bias circuit 304 is configured by variable current source 214 and transistor 212 that has a gate and a drain connected to each other and a source connected to a power supply, and receives a voltage input to bias input terminal VB at a gate of variable current source 214, converts the voltage into a current, supplies the current to transistor 212 forming a diode load, and generates and outputs a control voltage for controlling the DC currents of variable current sources 209 and 210 by current-voltage conversion.

Note that transistor 212 and variable current source 209 configure a current mirror via MOS switch 213, and have the same transistor length.

The operation of the class AB super source follower configured as described above will be described below. Since the sample and hold circuit is mounted in this embodiment, a sampling period and a hold period are present as operation states, and the embodiment will be described with reference to a timing chart together with FIG. 4.

Figure 5:
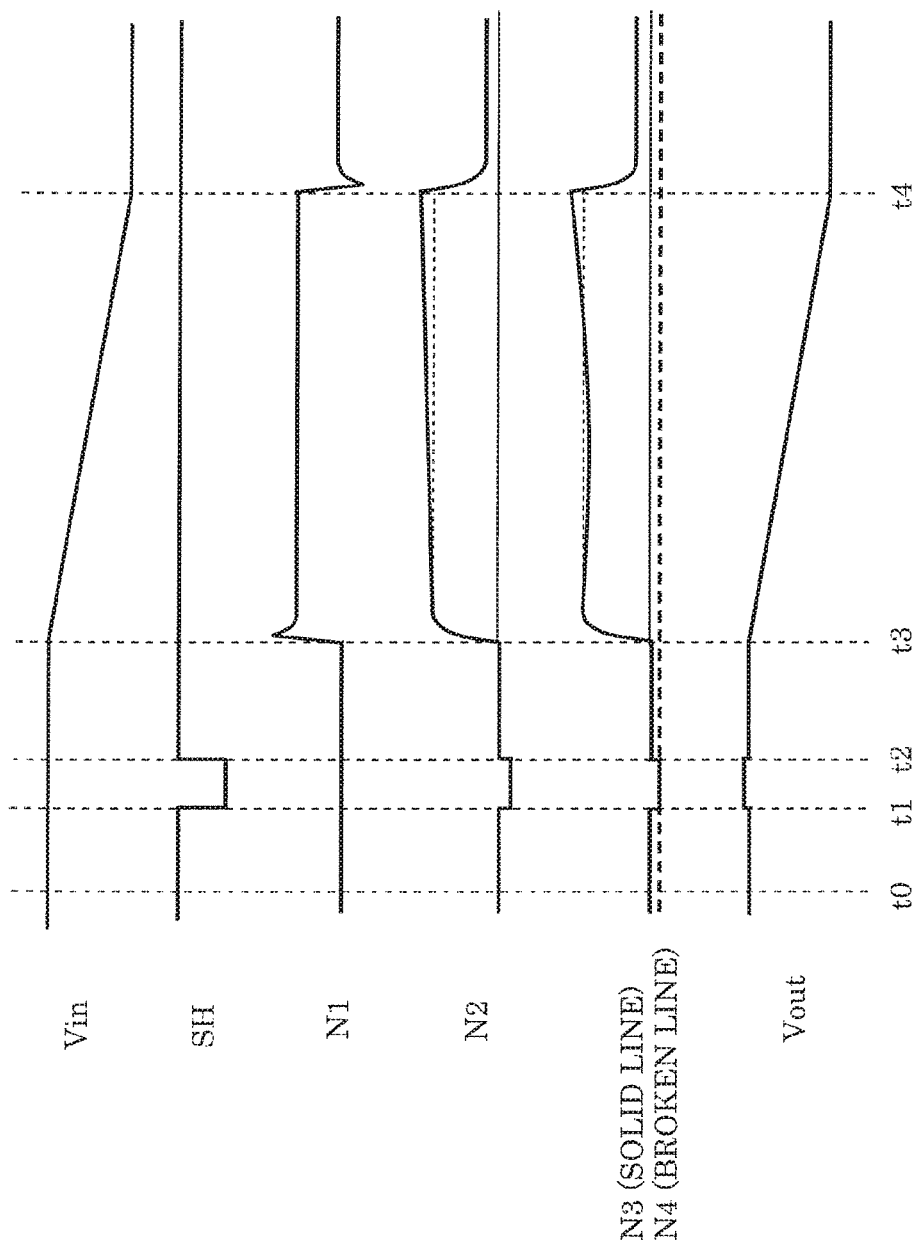
FIG. 5 is an operation timing chart according to Embodiment 1 of the present disclosure.

FIG. 5 is an operation timing chart of the present embodiment.

The time from time t1 to time t2 is a sampling period, and the other time is a hold period.

During the period from time t0 to time t3, the voltages of input terminal Vin and output terminal Vout are kept constant, and the charging and discharging to the load through output terminal Vout is not performed. It is necessary to perform sampling in this period.

Here at time t1, a control pulse is input to sample and hold control terminal SH, and MOS switch 213 conducts to sample the voltage of output N4 of bias circuit 304 into capacitor 400. At the same time, the current of variable current source 209 which forms a current mirror with transistor 212 of bias circuit 304 is determined.

At this time, when the current of variable current source 210 is smaller than the current of variable current source 209, the voltage at output terminal Vout increases due to the differential current, and the voltage between the gate and the source of transistor 208 decreases, so that drain N1 of transistor 208 increases. Amplifier 301 amplifies and outputs this fluctuation, and increases the voltage of node N2 to increase the current of variable current source 210. Conversely, when the current of variable current source 210 is larger, the voltage at output terminal Vout decreases due to the differential current, and the voltage between the gate and the source of transistor 208 increases, so that drain N1 of transistor 208 decreases. Amplifier 301 amplifies and outputs this fluctuation, and lowers the voltage of node N2 to reduce the current of variable current source 210. By this feedback operation, the current of variable current source 210 finally matches the current of variable current source 209, and the DC current is once determined.

Next, at time t2, when the sampling of the control pulse input to the sample and hold control terminal SH is completed, the sampled voltage is held in capacitor 400 with reference to the voltage of output N2 of amplifier 301 at the time when the DC current is determined. That is, the voltage difference between the gates of variable current sources 209 and 210 is held at capacitor 400.

At this time, the retained charge is redistributed due to the parasitic capacitance between the gate of MOS switch 213 and node N3, and a small offset occurs in the voltage of node N3.

In this case, since node N3 is not driven by bias circuit 304, an in-phase offset is also added to the voltage of node N3 of variable current source 210 via capacitor 400. The in-phase offsets are added to the gate voltages of variable current sources 209 and 210, and the increase and decrease of both DC currents are in opposite directions, so that a small differential current is generated without being canceled. This differential current is absorbed by the fluctuation of the current between the drain and the source of transistor 208 and is finally stabilized.

By the above series of operations, the DC currents of variable current sources 209 and 210 are determined.

Thereafter, when the voltage of input terminal Vin becomes a monotonically decreasing ramp signal at time t3, the voltage between the gate and the source of transistor 208 starts to decrease, the current between the drain and the source of transistor 208 decreases, and the voltage of drain N1 of transistor 208 increases. Then, the voltage of node N2 is increased by amplifier 301, and the voltage of node N3 is also increased via capacitor 400. At this time, node N2 and node N3 change in phase while substantially maintaining the held voltage difference. Therefore, the current of variable current source 209 having node N3 connected to the gate decreases, the current of variable current source 210 having node N2 connected to the gate increases, and the current is drawn from the load through output terminal Vout. Thereby, the voltage of output terminal Vout starts to decrease, and thereafter, the current between the drain and the source of transistor 208 is always maintained in an unchanged state by the feedback operation.

In the case of an ideal circuit, node N2 and node N3 have a constant value shown by a dotted line from time t3 to time t4 when input terminal Vin makes a transition with a constant slope, but in fact, the voltage changes as shown by a solid line.

The cause is a voltage fluctuation of node N3 due to a parasitic capacitance between the gate and the drain of variable current source 209. When the voltage of output terminal Vout continues to decrease, the voltage of node N3 decreases with a slope due to the parasitic capacitance between the gate and the drain of variable current source 209, and the current of variable current source 209 increases. Accordingly, drain N1 of transistor 208 slightly rises and is amplified by amplifier 301, and node N2 also gradually rises. That is, since node N3 also receives the fluctuation of node N2 via capacitor 400, the voltage of node N3 make a transition according to the strength relationship between the two.

At the beginning of the ramp signal, the voltage between the drain and source of variable current source 210 is sufficiently large, the saturation current increases due to the effect of the conductance between the drain and the source, and the balance to the current increase of variable current source 209 due to the fluctuation of node N3 can be achieved by the current control of variable current source 210 due to a small voltage rise at node N2. Therefore, the voltage of node N3 tends to decrease more strongly due to the influence of the parasitic capacitance between the gate and the drain of variable current source 209.

When the voltage of output terminal Vout decreases toward the end of the ramp signal, the saturation current of variable current source 210 decreases according to the reverse principle as described above, so that the rise of N2 increases to maintain the amount of current drawn from the load. As a result, node N3 starts to rise via capacitor 400.

Note that the currents of variable current sources 209 and 210 change in accordance with the voltages of node N2 and node N3, respectively, but since control is performed as a whole feedback system so that the current between the drain and the source of transistor 208 is kept constant, the voltage difference between input terminal Vin and output terminal Vout is kept constant, and the total current of all the current sources related to the charging and discharging to the load is kept constant, so that there is no effect on the characteristics due to the non-ideal factors.

At time t4, when the voltage of input terminal Vin stops decreasing, charging and discharging to the load stops, and the DC operating point in the circuit attempts to return to the state between time t2 and time t3. The voltages at nodes N2 and N3 goes to a state where a shift due to the voltage transition generated between time t3 and time t4 remains.

Since this voltage shift depends on the fluctuation due to the parasitic capacitance between the gate and the drain of variable current source 209 and the voltage level of output terminal Vout, the initial state can be restored by changing the voltage of input terminal Vin from the state at time t4 to the state at time t0 to cause a state change opposite to the above.

However, strictly speaking, since there is a leak current of capacitor 400, the reproducibility is deteriorated depending on the length of the operation time. Therefore, when the voltage of input terminal Vin is restored to the state at time t0, it is better to operate the sample and hold to initialize the state.

As described above, in the solid-state imaging device and the class AB super source follower according to Embodiment 1 of the present disclosure described above, the decrease in the drain voltage of transistor 208 caused by the voltage between the gate and the source of variable current source 209, which has been a hindrance to lowering the voltage, does not physically occur, and the conductance of both variable current sources 209 and 210 is multiplied by the amplification factor of amplifier 301, so that a lower output impedance than before can be realized.

Furthermore, since bias circuit 304 for controlling the output impedance can be realized with a very simple configuration, the solid-state imaging device and the class AB super source follower according to Embodiment 1 of the present disclosure described above are excellent in circuit scale and power.

Figure 6:
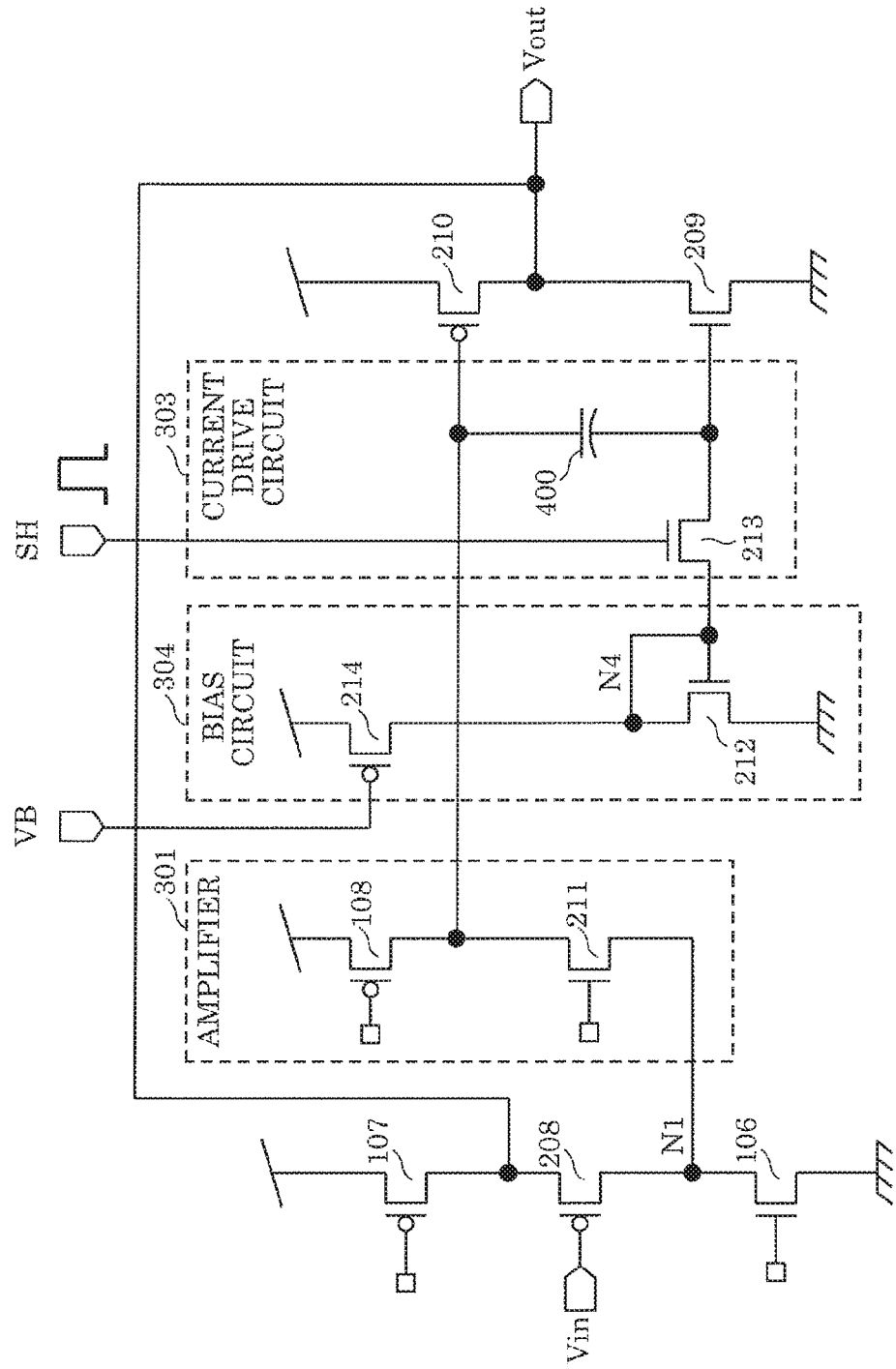
FIG. 6 is a diagram showing another class AB super source follower according to Embodiment 1 of the present disclosure.

Note that an N-type class AB super source follower has been described as an example in the above description. However, the present disclosure may be realized by a P-type class AB super source follower as shown in FIG. 6 by replacing all of the N-type transistors and the P-type transistors with each other, and exchanging the power supply and the ground with each other.

Figure 7:
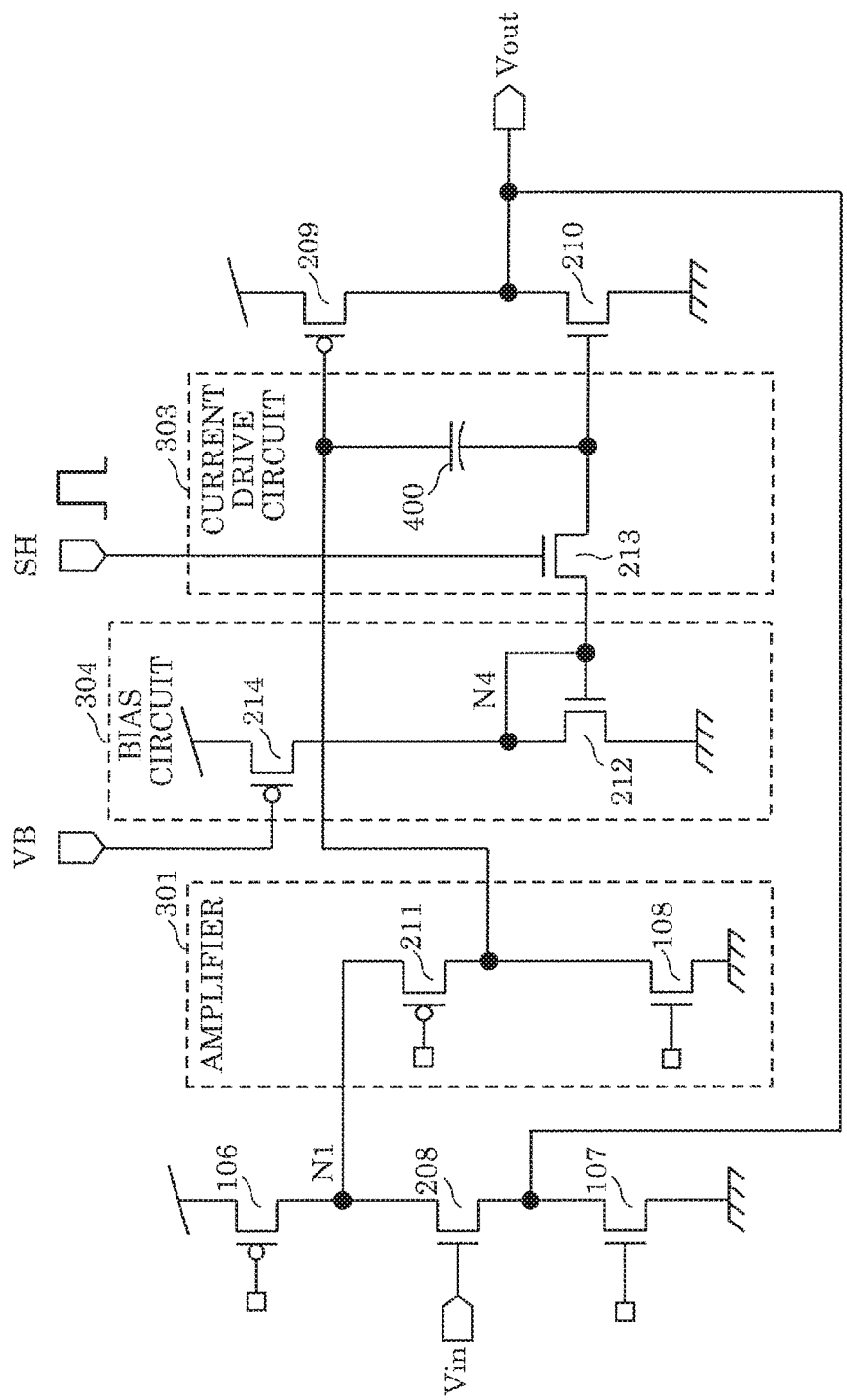
FIG. 7 is a diagram showing another class AB super source follower according to Embodiment 1 of the present disclosure.

In addition, exactly the same effect can be also obtained by the configuration shown in FIG. 7 in which all of the N-type transistors and the P-type transistors in bias circuit 304 and current driving circuit 303 are replaced with each other and the power supply and the ground are exchanged with each other in the N-type class AB super source follower of FIG. 4. In addition, this can be similarly applied to the P-type class AB super source follower shown in FIG. 6.

Figure 8:
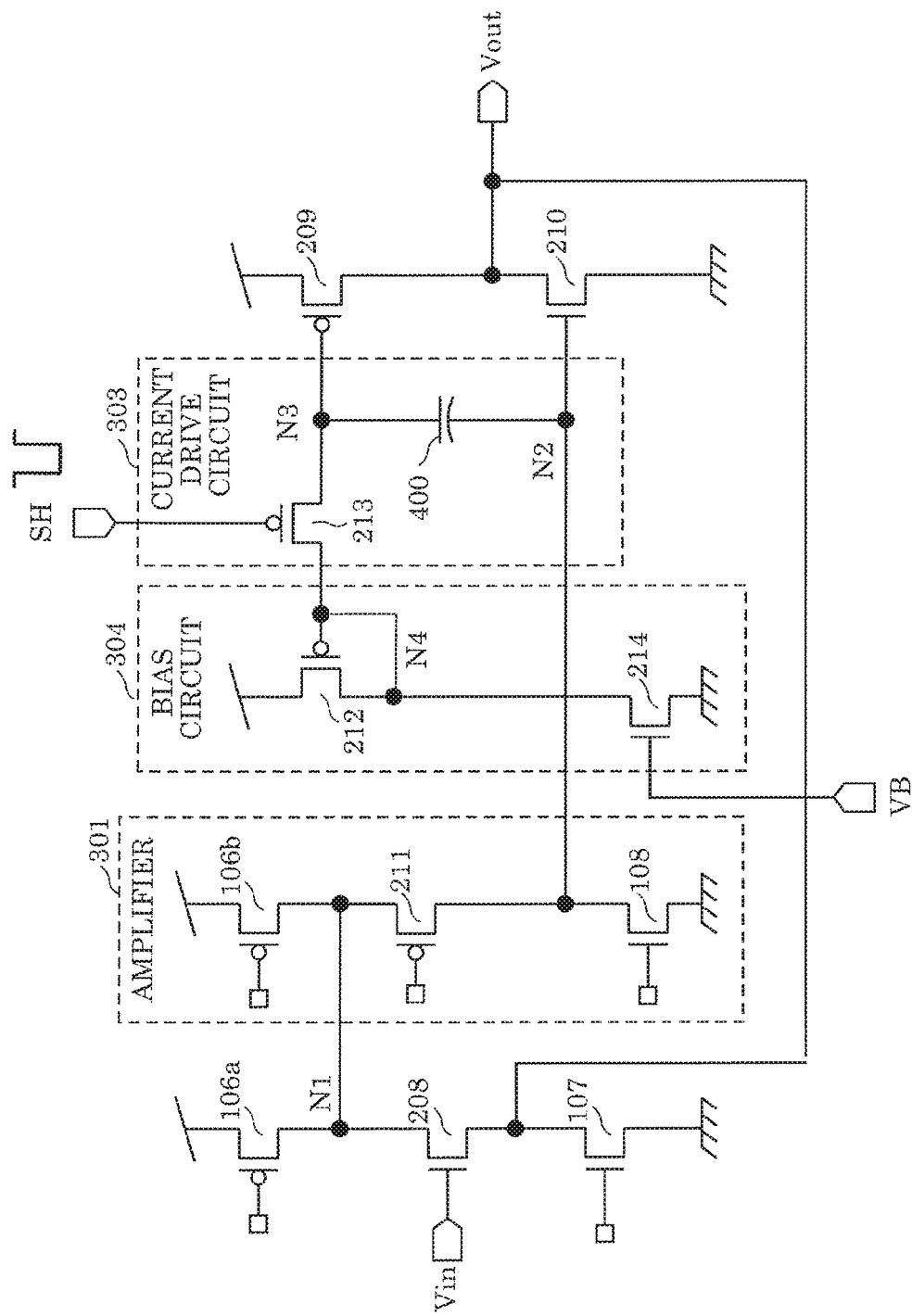
FIG. 8 is a diagram showing another class AB super source follower according to Embodiment 1 of the present disclosure.

In addition, constant current source 106 in FIG. 4 may be divided into two constant current sources 106a and 106b, and one of them may be connected to the source of transistor 211 inside amplifier 301 so that the current of constant current source 106a is equal to the current of constant current source 107 and the current of constant current source 106b is equal to the current of constant current source 108 as shown in FIG. 8. Thereby, for example, when the current of transistor 208 is controlled independently, if constant current source 107 and constant current source 106a are replaced with variable current sources, both current sources can be controlled with the same current change, so that the control circuit can be easily realized.

Figure 9:
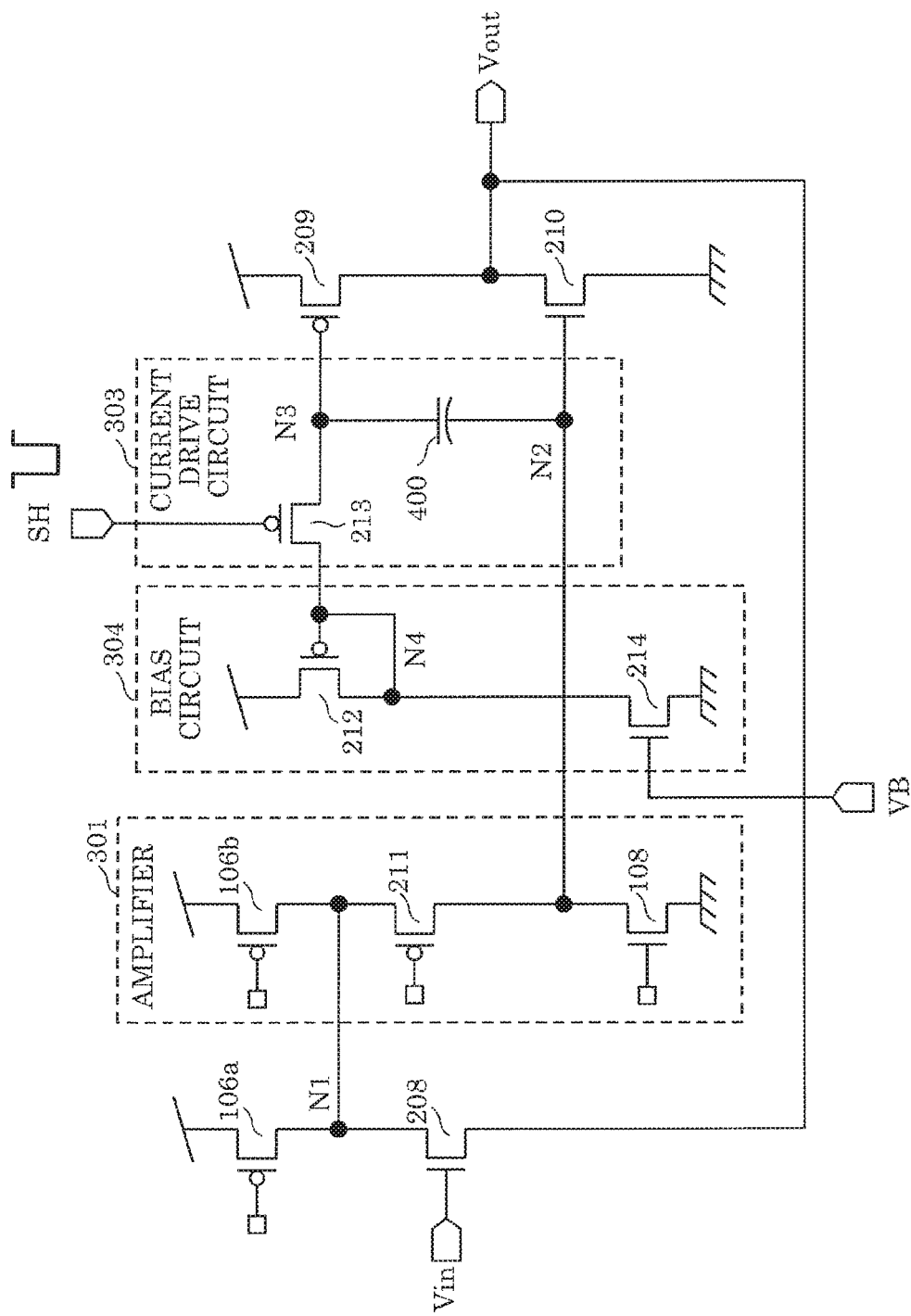
FIG. 9 is a diagram showing another class AB super source follower according to Embodiment 1 of the present disclosure.

Furthermore, constant current source 107 shown in FIG. 8 may be merged with variable current source 210 to be configured as shown in FIG. 9. In this case, the current of constant current source 106a is added as an offset to the current of variable current source 210. The operation is performed with the DC current of variable current source 209 different from the DC current of variable current source 210, but the effect is equivalent to the other configurations.

Figure 10:
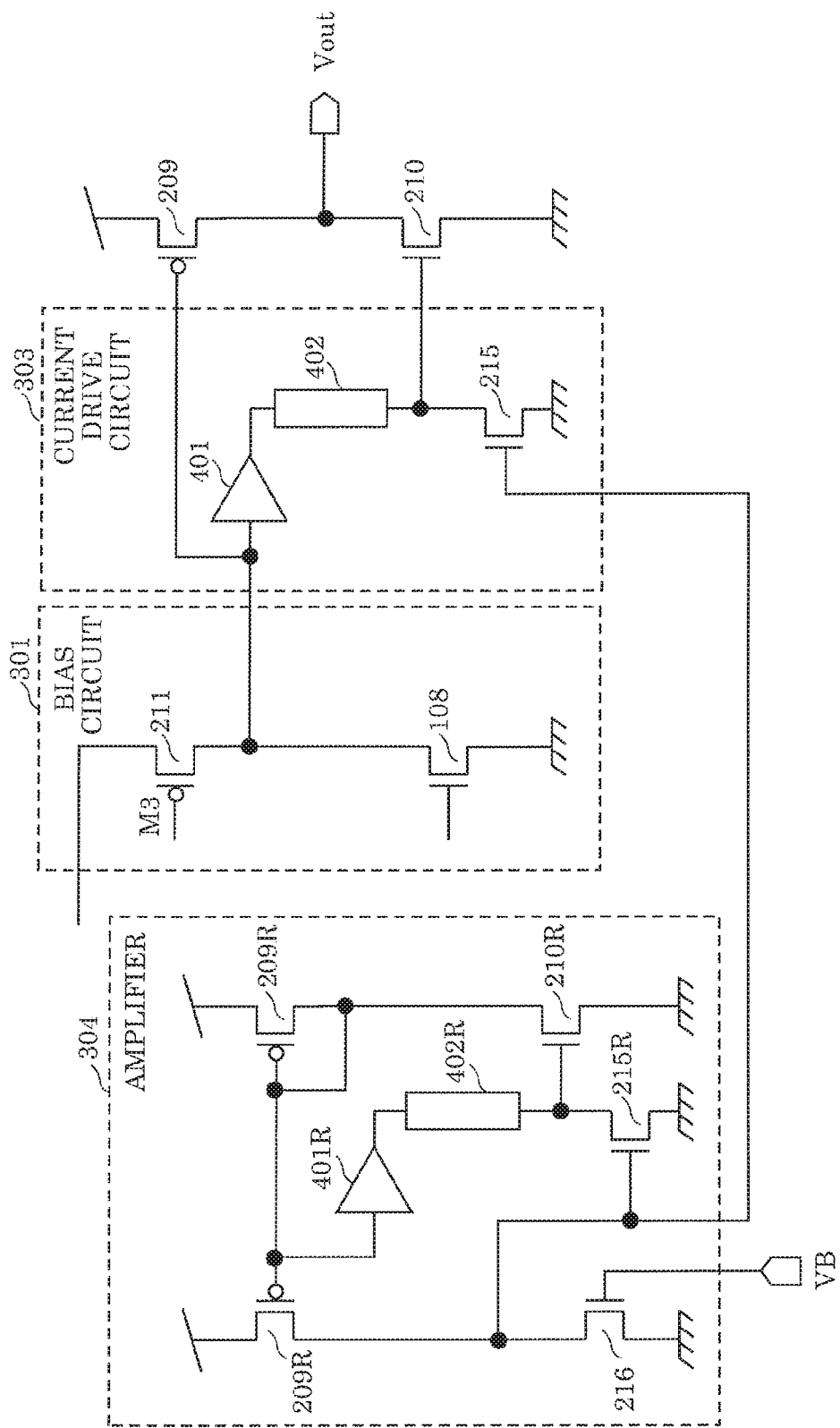
FIG. 10 is a diagram showing a configuration of another current control circuit according to Embodiment 1 of the present disclosure.

By the way, as described above, current control circuit 302 of the method (A) which does not use the sample and hold circuit can be also realized by the configuration shown in FIG. 10. Current driving circuit 303 is configured by impedance conversion buffer 401, current-voltage converter 402, and variable current source 215. Bias circuit 304 is configured by a replica of variable current sources 209 and 210 and current driving circuit 303, and the gate voltage of variable current source 215 is generated by bias circuit 304. In this case, an increase in power and an increase in the circuit size of bias circuit 304 are disadvantageous, but there is an advantage in that an external control pulse is unnecessary and there is no concern of leakage.

Note that although not shown because it does not directly contribute to the effect of the present disclosure, the class AB super source follower of the present disclosure may have insufficient phase margin of the feedback gain characteristic depending on the amplification factor of amplifier 301 and the conductance of variable current sources 209 and 210, so that in such a case, a phase compensation circuit needs to be added appropriately.

Embodiment 2

Figure 11:
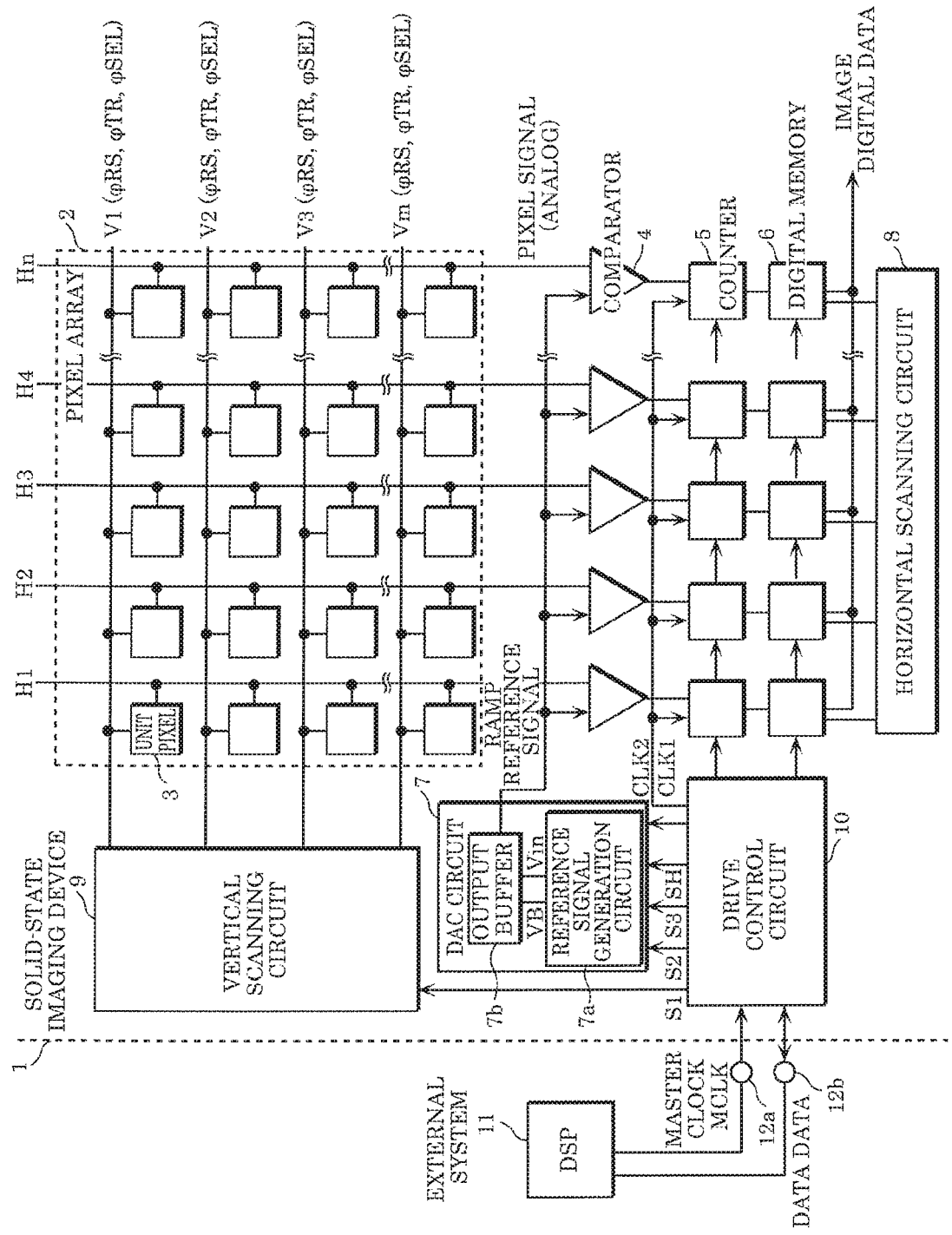
FIG. 11 is a diagram showing a solid-state imaging device according to Embodiment 2 of the present disclosure.

FIG. 11 is a diagram showing an embodiment of a solid-state imaging device using the class AB super source follower of the present disclosure as an output buffer of a DAC for supplying a reference ramp signal of an SS-ADC.

In FIG. 11, the solid-state imaging device includes pixel array 2 in which a plurality of unit pixels 3 are arranged in rows and columns, comparator 4 provided outside pixel array 2 and arranged in each vertical column, counter 5, digital memory 6, DAC circuit 7 for supplying a reference signal RAMP for AD conversion to comparator 4, and logic circuit 8.

Here, DAC circuit 7 includes reference signal generation circuit 7a and output buffer 7b, and the class AB super source follower of the present disclosure corresponds to output buffer 7b.

In addition, the solid-state imaging device includes a horizontal scanning circuit (also referred to as a column scanning circuit) 8 for controlling a column address and a column scanning, a vertical scanning circuit (also referred to as a row scanning circuit) 9 for controlling a row address and a row scanning, and drive control circuit 10 which receives master clock MCLK via terminal 12a and timing setting data from external system 12 via terminal 12b, and generates various internal clocks to control horizontal scanning circuit 8, vertical scanning circuit 9 and the like.

Figure 12:
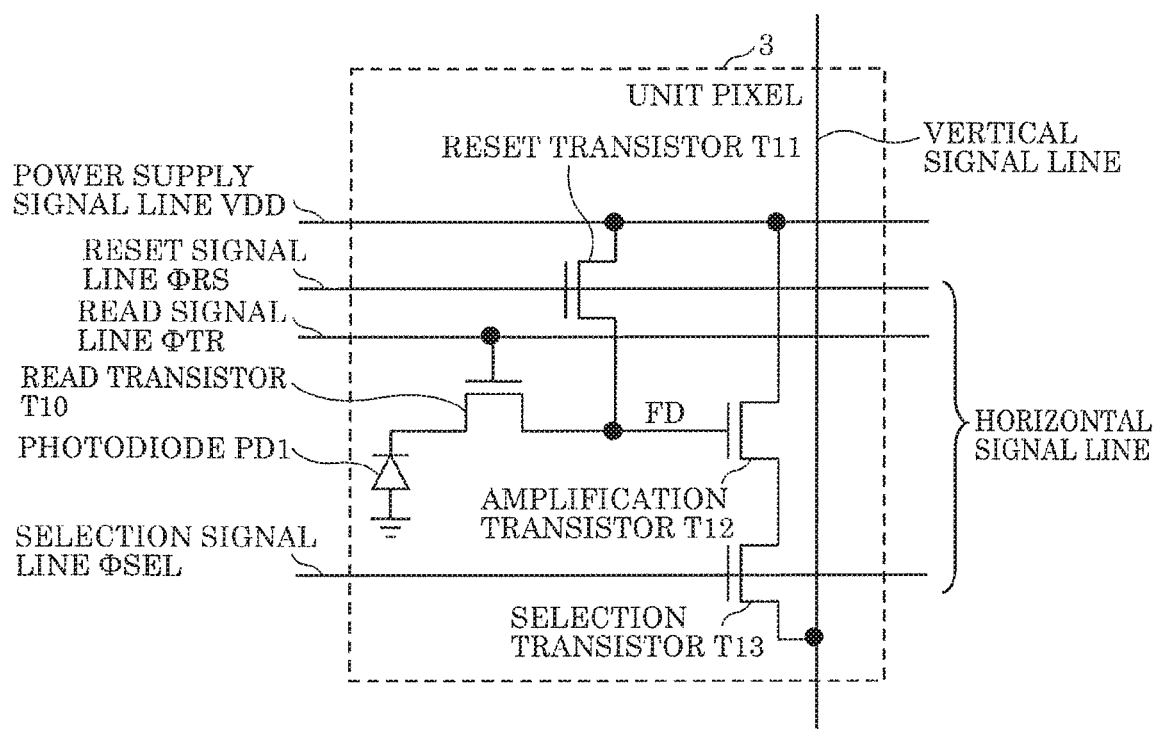
FIG. 12 is a diagram showing a configuration of a unit pixel according to Embodiment 2 of the present disclosure.

In addition, as shown in FIG. 12, each unit pixel 3 is connected with horizontal signal lines (also referred to as row control lines) V1 to Vm controlled by vertical scanning circuit 9 and vertical signal lines (also referred to as column control lines) H1 to Hn for transmitting pixel signals to comparator 4.

The pixel signal read from each unit pixel 3 is input to comparator 4 via a vertical signal line (H1, H2, . . . , Hn) for each horizontal signal line (V1, V2, . . . , Vm). Comparator 4 compares the analog pixel signal with reference signal RAMP supplied from DAC circuit 7. Counter 5 counts the time until the comparison processing of comparator 4 is completed, and the result is stored in digital memory 6. An AD conversion function is realized by this series of operations.

In addition, reference signal RAMP generated by DAC circuit 7 is input to one input terminal of comparator 4 in common with one input terminal of other comparators 4, and each corresponding vertical signal line (H1, H2, . . . , Hn) is connected to the other input terminal to individually input a pixel signal voltage from pixel array 2. The output signal of comparator 4 is supplied to counter 5.

In counter 5, reference signal RAMP input to comparator 4 starts a ramp wave, and at the same time, starts counting with the clock signal, the counting is performed until a pulse signal is obtained from comparator 4 by a comparison match between the analog pixel signal input via vertical signal lines (H1, H2, . . . , Hn) and reference signal RAMP, and thereby the A/D conversion is performed.

In addition, at this time, a process of calculating a difference between a data component (reset component Vrst+signal component Vsig) including reset component Vrst (including noise) immediately after the pixel reset and a true signal component (according to the amount of received light) and an analog voltage pixel signal input via the vertical signal lines (H1, H2, . . . , Hn) is performed. That is, a total of two A/D conversions of the reset component and the data component read from unit pixels 3 in an arbitrary row of pixel array 2 are performed.

Thereby, it becomes possible to extract only the true signal level Vsig by eliminating variations in clock skew, counter delay, and the like in each column that cause an error between columns in AD conversion. That is, digital CDS becomes possible.

A method for driving the solid-state imaging device according to Embodiment 2 of the present disclosure that realizes the above operation will be described with reference to a timing chart.

Figure 13:
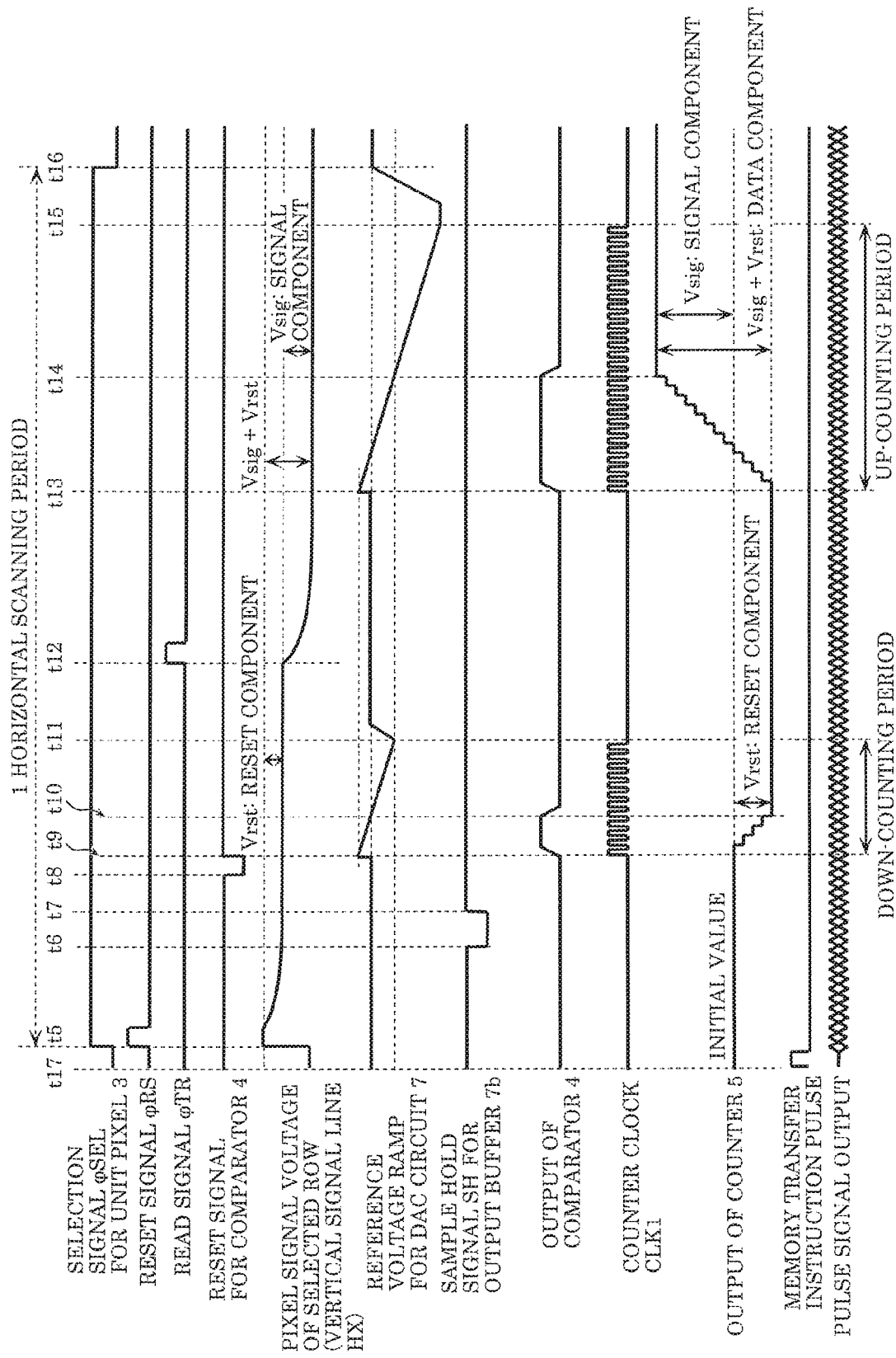
FIG. 13 is an operation timing chart of the solid-state imaging device according to Embodiment 2 of the present disclosure.

FIG. 13 shows the timing of the reading of the pixel signal and the AD conversion operation within one horizontal scanning period.

First, for the first reading, drive control circuit 10 resets the count value of counter 5 to the set initial value, and sets counter 5 to the down-counting mode. Here, the initial value of the count value may be "0" or an arbitrary value.

Next, in FIG. 12, first, selection signal line ΦSEL goes to High level at time t5 in FIG. 13 to turn on selection transistor T13 of the unit pixel, and selected row Vx is selected.

Next, in a state where read signal line ΦTR goes to Low level and read transistor T10 is turned off, reset signal line cRS goes to High level at time t5 in FIG. 13 to turn on reset transistor T11, and the voltage of floating diffusion node FD of each unit pixel 3 is reset.

Next, in a state where the voltage of floating diffusion node FD has been reset after a certain period of time, reset signal line ΦRS goes to Low level and reset transistor T11 is turned off.

Then, the voltage of floating diffusion node FD of each unit pixel 3 is amplified by amplification transistor T13, and the reset component (Vrst) is read out via the vertical signal line. The reading of the potential of the vertical signal line is performed by down counting.

At the time of this down counting, drive control circuit 10 supplies control signals S2, S3, and SH to DAC circuit 7. Control signal S2 is a register signal for controlling the initial offset voltage of reference signal RAMP, control signal S3 is a register signal for controlling the output impedance of output buffer 7b, and control signal SH is a sample and hold control pulse for output buffer 7b. Control signals S2 and S3 are input to reference signal generation circuit 7a, and control voltage VB and reference voltage Vin are generated and input to output buffer 7b. Control signal SH is directly input to output buffer 7b.

First, DAC circuit 7 outputs an initial offset voltage corresponding to the value of control signal S2 as a comparison voltage to one input terminal of comparator 4. Thereafter, reference signal RAMP that is time-changed in a sloping manner is continuously output. Prior to this, control signal SH goes to Low level at time t6, and the sampling operation of the sample and hold circuit of output buffer 7b is started. The DC current of the variable current sources (variable current sources 209 and 210 in FIG. 4) of output buffer 7b is set according to the value of control signal S3, and the output impedance is determined by the feedback operation of output buffer 7b as described above. Thereafter, control signal SH goes to High level at time t7, and the sample and hold circuit of output buffer 7b enters a hold state.

At time t8, comparator 4 receives the reset signal and is initialized. At the same time as the reset release at time t9, DAC circuit 7 transitions the initial offset voltage to the start voltage of reference signal RAMP, and initializes the output of comparator 4 to High level.

Thereafter, clocks CLK1 and CLK2 synchronized with each other are supplied from drive control circuit 10 to counter 5 and DAC circuit 7, respectively, and comparator 4 starts to compare reference signal RAMP with the voltages of the reset component (Vrst) of the pixels output to vertical signal lines H1 to Hn, and counter 5 starts counting down from the set initial value.

Comparator 4 compares reference signal RAMP with the voltage (Vrst) of the pixel reset component of the selected Vx row input via vertical signal lines H1 to Hn, and when both voltages become the same, the output is inverted from High level to Low level (time t10).

That is, the voltage according to the reset component Vrst is compared with reference signal RAMP, and the magnitude in the time axis direction corresponding to the magnitude of the reset component Vrst is counted by the counter clock CLK1, whereby a count value corresponding to the magnitude of the reset component Vrst is obtained. In other words, counter 5 obtains a count value corresponding to the magnitude of reset component Vrst by down-counting until the output of comparator 4 is inverted with the start time of reference signal RAMP as the start time of the down-counting of counter 5.

When a predetermined down-counting period has elapsed (t11), drive control circuit 10 stops supplying control data to comparator 4 and supplying clocks CLK1 and CLK2 to DAC circuit 7 and counter 5. Thereby, comparator 4 stops comparing reference signal RAMP with the voltage of the pixel reset component.

Then, output voltage Vin of reference signal generation circuit 7a of DAC circuit 7 returns to the initial voltage at time t5, and reference signal RAMP also returns to the initial offset voltage.

At this time, the voltage across the capacitance (capacitance 400 in FIG. 4) of output buffer 7b and the DC voltage of the internal node return to the state between times t7 and t8.

At the time of the first reading, reset component Vrst in the pixel signal voltage of the selected Vx row is detected by comparator 4 and the counting operation is performed, so that reset component Vrst of unit pixel 3 is read out.

Then, once the AD conversion of the pixel reset component is completed, subsequently, the second pixel signal reading operation is started. At the time of the second reading, an operation of reading signal component Vsig corresponding to the amount of incident light for each unit pixel 3 in addition to reset component Vrst is performed. The difference from the first reading is that counter 5 is set to the up-counting mode and that the sample and hold circuit of output buffer 7b does not perform a sampling operation and maintains a hold state.

The reason why the hold is maintained is that a change in noise superimposed on reference signal RAMP causes image quality deterioration such as a random horizontal line. As described above, the AD conversion error is suppressed by the digital CDS based on the difference between the two AD conversion results of the down-counting and the up-counting. However, if sampling is performed before the up-counting, when the noise superimposed on reference signal RAMP is different at a level exceeding the quantization noise between the down-counting and the up-counting, an error occurs without being canceled by the digital CDS. Therefore, the AD conversion is performed twice in the hold state before the down-counting, thereby preventing the performance of the digital CDS from deteriorating.

First, when read signal line ΦTR goes to High level to turn on read transistor T10 at time t12, all the photocharges accumulated in photodiode PD (light receiver) 1 are transmitted to floating diffusion node FD. Thereafter, read signal line ΦTR goes to Low level to turn off read transistor T10.

Then, data component (Vrst+Vsig) of amplification transistor T12 is read via vertical signal lines H1 to Hn.

Reading of the potentials of vertical signal lines H1 to Hn is performed by up-counting.

At the time of up-counting, a comparison between reference signal RAMP, which is time-changed in an inclined manner by DAC circuit 7, and the voltage of the pixel signal component of selected row Vx input via vertical signal lines H1 to Hn of each column is made by comparator 4.

Next, at time t13, DAC circuit 7 transitions the initial offset voltage to the start voltage of reference signal RAMP, and resets the output of comparator 4 to High level again. Thereafter, docks CLK1 and CLK2 synchronized with each other are supplied from drive control circuit 10 to counter 5 and DAC circuit 7, respectively. Comparator 4 starts to compare reference signal RAMP with the voltages of data components (Vrst+Vsig) of the pixel signal components output to vertical signal lines H1 to Hn. Counter 5 starts up-counting from the count value at which down-counting has stopped.

Comparator 4 compares reference signal RAMP with the data component (Vrst+Vsig) of the pixel signal component of the selected Vx row input via vertical signal lines H1 to Hn. When both voltages become the same, the output is inverted from H level to L level (time t14).

That is, the voltage signal corresponding to the data component (Vrst+Vsig) is compared with reference signal RAMP, and the magnitude in the time axis direction corresponding to the magnitude of signal component Vsig is counted by counter clock CLK1. Thereby, a count value corresponding to the magnitude of signal component Vsig can be obtained. In other words, counter 5 obtains the count value corresponding to the magnitude of the data component (Vrst+Vsig) by up-counting with the starting time of the change in the ramp waveform as the starting time of up-counting of counter 5 until the output of comparator 4 is inverted.

In this way, by setting counter 5 to down-counting when reading reset component (Vrst) and up-counting when reading data component (Vrst+Vsig), the digital CDS automatically performs subtraction in counter 5 to obtain signal component Vsig by obtaining a corresponding count value.

Thereafter, similarly to the down-counting, the control signal to comparator 4 and clocks CLK1 and CLK2 are stopped, reference signal RAMP returns to the initial offset voltage, selection signal line ΦSEL goes to Low level at time t16, and the AD conversion of the pixel signal of row Vx of the pixel array is completed.

Then, before the operation of counter 5 (time t17), the AD-converted data is transferred from timing controller 11 to digital memory 6 based on the memory transfer instruction pulse control signal.

With the above operations, the solid-state imaging device according to Embodiment 2 of the present disclosure sequentially outputs a pixel signal for each vertical column in each row from pixel array 2 in which light receiving elements as a charge generation portion are arranged in a matrix. Then finally, one image, that is, a frame image, for pixel array 2 in which the light receiving elements are arranged in a matrix is output as a sequence of image digital data in pixel units.

The point of the disclosure in the present embodiment is that the effect of suppressing streaking of images and random horizontal noise caused by a reference signal common to all columns, which is peculiar to the column-parallel-type SS-ADC, to improve image quality by being equipped with an output buffer in which the output impedance is drastically reduced and the analog power supply voltage can be reduced without impairing the signal dynamic range as an output buffer of a DAC circuit that outputs a reference signal of an SS-ADC, and suppressing the entire power increase by reducing the power of the analog circuit against the power increase due to the improvement in the processing speed of the pixel signal for high-speed frame imaging in addition to the increase in the number of rows and columns of the pixel array due to the increase in the number of pixels can be obtained.

In addition, since the output impedance of the DAC circuit can be controlled from outside the solid-state imaging device, the image quality can be adjusted optimally after mounting.

Furthermore, although not specifically shown, since currents can be optimally tuned according to the use situation in such a configuration that constant current sources 106 and 107 in FIG. 7 (or constant current sources 106a and 107 in FIG. 8) are variable current sources, and can be externally controlled like control signals S2 and S3, the common DAC circuit can be generally used for various solid-state imaging devices.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, the present disclosure can realize a reduction in power supply voltage and an improvement in image quality characteristics, and can be applied to a wide range of applications such as on-vehicle surveillance cameras using a MOS solid-state imaging device or an organic film solid-state imaging device, professional cameras for broadcast, movie or the like, digital still cameras, movies, public surveillance cameras, and medical endoscope cameras.

In addition, the class AB super source follower of the present disclosure can be used without limitation in the field as long as it is used for driving a heavy load with low output impedance.

What is claimed is:

1. A solid-state imaging device comprising:
    a pixel array including a plurality of light receivers; and
    a Digital to Analog Converter (DAC) circuit that generates and outputs a reference ramp signal, wherein
    the DAC circuit includes a reference signal generation circuit and an output buffer, and supplies, with a low output impedance, the reference ramp signal generated by the reference signal generation circuit to each of a plurality of comparators using the output buffer, and
    the output buffer includes:
        a first variable current source that supplies current to a load;
        a second variable current source that draws current from the load; and
        a feedback circuit that performs current control of the first variable current source and the second variable current source.

2. The solid-state imaging device according to claim 1, wherein
    the output buffer includes a first transistor connected to the first variable current source, and
    the feedback circuit performs the current control based on a signal for sensing a fluctuation in a current flowing through the first transistor.

3. The solid-state imaging device according to claim 2, wherein
    the feedback circuit includes an amplifier that senses a fluctuation in a current flowing through a source-drain path of the first transistor and outputs, as the signal, an amplified signal from a drain of the second transistor having a gate voltage fixed to a predetermined potential.

4. The solid-state imaging device according to claim 1, wherein
    the feedback circuit outputs a first control voltage and a second control voltage, and includes a current control circuit that controls respective currents of the first variable current source and the second variable current source by the first and second control voltages in accordance with at least a current supply to the load or a current sink from the load.

5. The solid-state imaging device according to claim 4, wherein
    the first and second variable current sources are each a source-grounded transistor, and
    the current control circuit includes a bias circuit that receives a signal defining DC currents of the first and second variable current sources and controls a first DC voltage of the first control voltage and a second DC voltage of the second control voltage.

6. The solid-state imaging device according to claim 5, wherein
    the bias circuit includes a third transistor that has a drain and a gate that are short-circuited and has a source connected to a power supply having a voltage identical to a voltage of a source of one of the first or second variable current sources.

7. The solid-state imaging device according to claim 1, wherein
    the output buffer has a function of controlling an output impedance by controlling DC currents of the first and second variable current sources.

8. The solid-state imaging device according to claim 1, wherein
    the reference signal generation circuit has a function of switching between and outputting, as the reference ramp signal, a steady initial offset voltage and a ramp signal having a constant voltage change per unit time.

9. The solid-state imaging device according to claim 8, further comprising:
    a drive control circuit that determines the DC currents of the first and second variable current sources within a period in which the reference signal generation circuit outputs an initial offset voltage, and then controls timing so that the reference signal generation circuit outputs a ramp signal.

10. A class AB super source follower, comprising:
    a first transistor having a gate connected to an input terminal, a source connected to an output terminal and a first constant current source, and a drain connected to a second constant current source;
    a first variable current source that is connected to the output terminal, and supplies current to the load when current supply to a load connected to the output terminal is required;
    a second variable current source that is connected to the output terminal, and draws current from the load when current sinking from the load is required; and
    a feedback circuit that is connected to the drain of the first transistor and controls currents of the first variable current source and the second variable current source complementarily to each other based on a signal amplified by sensing a fluctuation in a current flowing through the first transistor.

* * * * *